United States Patent
Cheng

(10) Patent No.: US 12,371,791 B2
(45) Date of Patent: Jul. 29, 2025

(54) SYSTEM AND METHOD FOR DYNAMICALLY ADJUSTING THIN-FILM DEPOSITION PARAMETERS

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 553 days.

(21) Appl. No.: 17/150,699

(22) Filed: Jan. 15, 2021

(65) Prior Publication Data

US 2022/0228265 A1   Jul. 21, 2022

(51) Int. Cl.
| | |
|---|---|
| *C23C 16/52* | (2006.01) |
| *C23C 16/455* | (2006.01) |
| *C23C 16/458* | (2006.01) |
| *G05B 13/04* | (2006.01) |
| *H01L 21/02* | (2006.01) |

(52) U.S. Cl.
CPC ........ *C23C 16/52* (2013.01); *C23C 16/45525* (2013.01); *C23C 16/4583* (2013.01); *G05B 13/048* (2013.01); *H01L 21/02181* (2013.01); *H01L 21/0228* (2013.01)

(58) Field of Classification Search
CPC .............. C23C 16/52; C23C 16/45525; C23C 16/4583
See application file for complete search history.

(56) References Cited

U.S. PATENT DOCUMENTS

| | | | |
|---|---|---|---|
| 2012/0269968 A1* | 10/2012 | Rayner, Jr. ........ | H01J 37/32449 118/728 |
| 2013/0273237 A1* | 10/2013 | Johnson ............. | G01B 11/0683 427/9 |
| 2015/0098084 A1* | 4/2015 | Felts .................... | G01G 19/414 356/432 |

(Continued)

FOREIGN PATENT DOCUMENTS

| | | |
|---|---|---|
| CN | 106521459 A | 3/2017 |
| CN | 106521459 B | 4/2018 |

(Continued)

OTHER PUBLICATIONS

Travis, Curtisha D., et al., "Dynamic Modeling for the Design and Cyclic Operation of an Atomic Layer Deposition (ALD) Reactor". Processes 2013, 1, 128-152.*

(Continued)

*Primary Examiner* — Bret P Chen
(74) *Attorney, Agent, or Firm* — Seed IP Law Group LLP

(57) ABSTRACT

A thin-film deposition and method deposits thin films on semiconductor wafers. The thin-film deposition utilizes an analysis model that dynamically selects process conditions for a next deposition process by receiving static process conditions and target thin-film data. The analysis model identifies dynamic process conditions data that, together with the static process conditions data, result in predicted thin-film data that matches the target thin-film data. The deposition method then uses the static and dynamic process conditions data for the next thin-film deposition process.

20 Claims, 7 Drawing Sheets

(56) References Cited

U.S. PATENT DOCUMENTS

| | | | |
|---|---|---|---|
| 2015/0369043 A1* | 12/2015 | Pelletier | G01N 21/59 |
| | | | 356/416 |
| 2016/0187288 A1* | 6/2016 | Cheng | G01N 27/4145 |
| | | | 257/253 |
| 2017/0263452 A1* | 9/2017 | Su | H01L 21/02568 |
| 2019/0072482 A1* | 3/2019 | Feng | G01N 21/25 |
| 2019/0109029 A1* | 4/2019 | Cinar | H01L 22/12 |
| 2020/0006085 A1* | 1/2020 | Yeh | H01L 21/0273 |
| 2020/0033820 A1 | 1/2020 | Furuya et al. | |
| 2020/0126829 A1* | 4/2020 | Matsui | H01L 21/31 |
| 2020/0140993 A1 | 5/2020 | Noh | |
| 2020/0176121 A1* | 6/2020 | Dalal | G16H 20/60 |
| 2020/0194049 A1* | 6/2020 | Nikonov | G06N 3/065 |
| 2020/0201952 A1 | 6/2020 | Kim et al. | |
| 2022/0171373 A1* | 6/2022 | Chau | C23C 14/54 |
| 2022/0228265 A1* | 7/2022 | Cheng | C23C 16/52 |
| 2022/0269177 A1* | 8/2022 | Carcasi | G03F 7/162 |
| 2023/0195078 A1* | 6/2023 | Zhang | C23C 16/52 |
| | | | 700/159 |

FOREIGN PATENT DOCUMENTS

| | | |
|---|---|---|
| CN | 111479952 A | 7/2020 |
| DE | 102020100565 A1 | 7/2021 |
| EP | 3819930 A | 5/2021 |
| JP | 2005200730 A | 7/2005 |
| KR | 101965605 B1 | 8/2019 |
| KR | 10-2020-0101919 A | 8/2020 |
| TW | 201946178 A | 12/2019 |
| TW | 202030652 A | 8/2020 |
| TW | 202032407 A | 9/2020 |

OTHER PUBLICATIONS

Cendejas, Austin, et al., "Modeling atomic layer deposition process parameters to achieve dense nanocrystal-based nanocomposites". J. Vac. Sci. Technol. A 39, 012406 (2021) pp. 1-12.*

Chang, Silliang, et al., "Growth behavior and structural analysis of atomic layer deposited SnxTi12xOy films". J. Vac. Sci. Technol. A 36(1), Jan./Feb. 2018, pp. 1-8.*

Oviroh, PeterOzaveshe, et al., "New development of atomic layer deposition: processes, methods and applications". Science and Technology of Advanced Materials, 2019, vol. 20, No. 1, 465-496.*

Xu, Hongyan, et al., "Atomic layer deposition—state-of-the-art approach to nanoscale hetero-interfacial engineering of chemical sensors electrodes: A review". Sensors & Actuators: B. Chemical 331 (2021) 129403, pp. 1-27.*

* cited by examiner

SYSTEM AND METHOD FOR DYNAMICALLY ADJUSTING THIN-FILM DEPOSITION PARAMETERS

BACKGROUND

Technical Field

The present disclosure relates to the field of thin-film deposition.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

To continue decreasing the size of features in integrated circuits, various thin-film deposition techniques are implemented. These techniques can form very thin films.

However, thin-film deposition techniques also face serious difficulties in ensuring that the thin films are properly formed.

DETAILED DESCRIPTION

Figure 1:
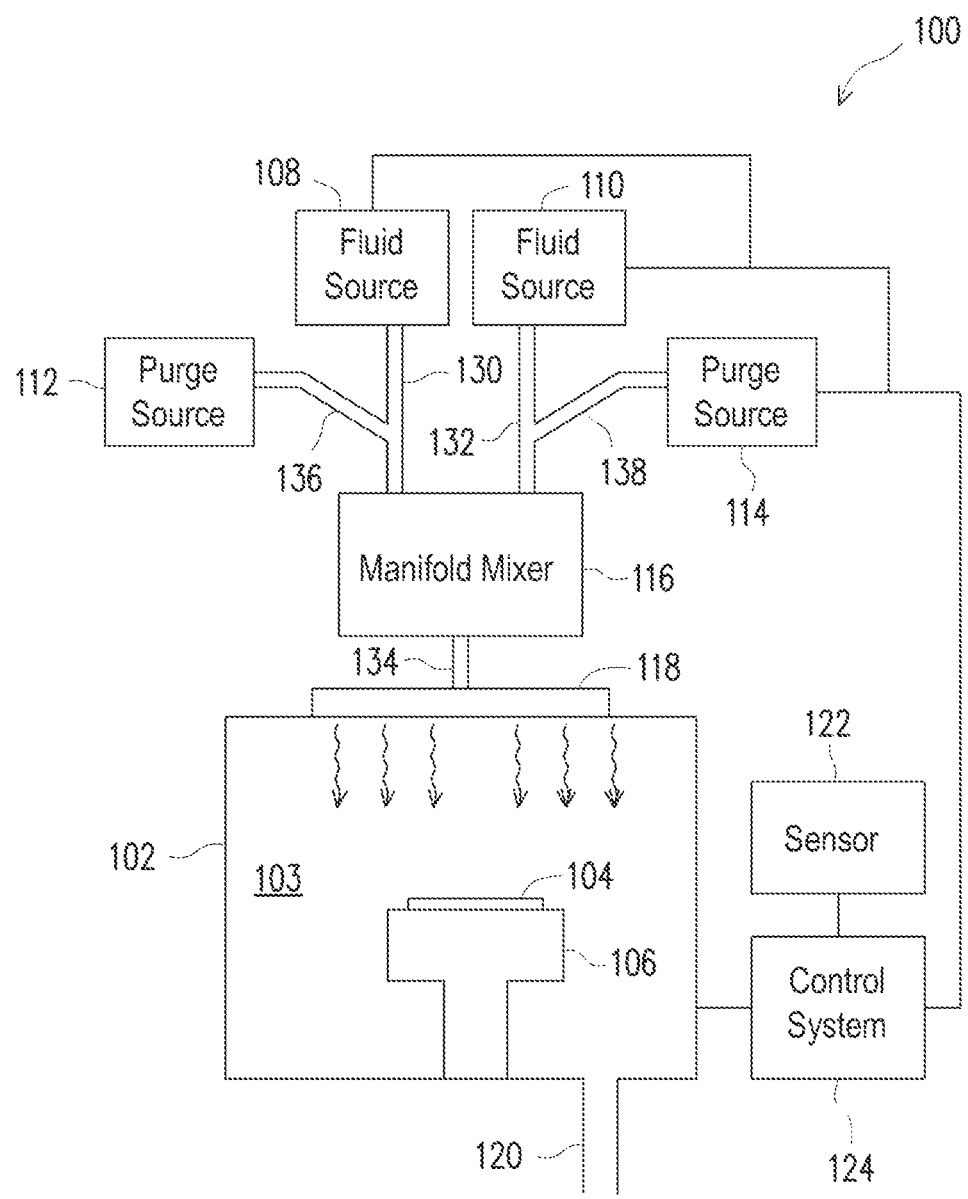
FIG. 1 is an illustration of a thin-film deposition system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide thin films of reliable thickness and composition. Embodiments of the present disclosure utilize machine learning techniques to adjust thin-film deposition process parameters between deposition processes or even during deposition processes. Embodiments of the present disclosure utilize machine learning techniques to train an analysis model to determine process parameters that should be implemented for a next thin-film deposition process or even for a next phase of a current thin-film deposition process. The result is that thin-film deposition processes produce thin films having thicknesses and compositions that reliably fall within target specifications. Integrated circuits that include the thin films will not have performance problems that can result if the thin films are not properly formed. Furthermore, batches of semiconductor wafers will have improved yields and fewer scrapped wafers.

FIG. 1 is a block diagram of a thin-film deposition system 100, according to one embodiment. The thin-film deposition system 100 includes a thin-film deposition chamber 102 including an interior volume 103. A support 106 is positioned within the interior volume 103 and is configured to support a substrate 104 during a thin-film deposition process. The thin-film deposition system 100 is configured to deposit a thin film on the substrate 104. The thin-film deposition system 100 includes a control system 124 that dynamically adjusts thin-film deposition parameters. Details of the control system 124 are provided after description of the operation of the thin-film deposition system 100.

In one embodiment, the thin-film deposition system 100 includes a first fluid source 108 and a second fluid source 110. The first fluid source 108 supplies a first fluid into the interior volume 103. The second fluid source 110 supplies a second fluid into the interior volume 103. The first and second fluids both contribute in depositing a thin film on the substrate 104. While FIG. 1 illustrates fluid sources 108 and 110, in practice, the fluid sources 108 and 110 may include or supply materials other than fluids. For example, the fluid sources 108 and 110 may include material sources that provide all materials for the deposition process.

In one embodiment, the thin-film deposition system 100 is an atomic layer deposition (ALD) system that performs ALD processes. The ALD processes form a seed layer on the substrate 104. The seed layer is selected to chemically interact with a first precursor gas, such as the first fluid supplied by the first fluid source 108. The first fluid is supplied into the interior volume 103. The first fluid reacts with the seed layer to form new compounds with each atom or molecule of the surface of the seed layer. This corresponds to the deposition of a first layer, or a first step in deposition of the first layer of the thin film. FIG. 1 and the figures herein are described primarily with reference to an ALD system. However, other types of thin-film deposition systems can be utilized without departing from the scope of the present disclosure. These and other types of thin-film deposition systems can include chemical vapor deposition systems, physical vapor deposition systems, or other types of deposition systems.

The reaction between the seed layer and the first fluid results in a byproduct. After flowing the first fluid for a selected amount of time, a purge gas is supplied into the interior volume to purge the byproducts of the first fluid, as well as the unreacted portions of the first fluid, from the interior volume 103 through the exhaust channel 120.

After the first fluid has been purged, a second precursor gas, such as the second fluid is supplied into the interior volume from the second fluid source 110. The second fluid reacts with the first layer to form a second layer on top of the first layer. Alternatively, the flow of the second fluid can complete the formation of the first layer by reacting with the first portion of the first layer. This reaction can also result in byproducts. A purge gas is again supplied into the interior volume 103 to purge the byproducts of the second fluid, as well as the unreacted portions of the second fluid, from the interior volume 103. This sequence of supplying the first fluid, purging, supplying the second fluid, and purging again is repeated until the thin film has a selected thickness.

The parameters of a thin film generated by the thin-film deposition system 100 can be affected by large number of process conditions. The process conditions can include, but are not limited to, an amount of fluid or material remaining in the fluid sources 108, 110, a flow rate of fluid or material from the fluid sources 108, 110, the pressure of fluids provided by the fluid sources 108 and 110, the length of tubes or conduits that carry fluid or material into the deposition chamber 102, the age of an ampoule defining or included in the deposition chamber 102, the temperature within the deposition chamber 102, the humidity within the deposition chamber 102, the pressure within the deposition chamber 102, light absorption or reflection within the deposition chamber 102, surface features of the semiconductor wafer 104, the composition of materials provided by the fluid sources 108 and 110, the phase of materials provided by the fluid sources 108 and 110, the duration of the deposition process, the duration of individual phases of the deposition process, and various other factors, including factors not specifically listed above.

The combination of the various process conditions during the deposition process determines the thickness, composition, or crystal structure, or other parameters of a thin film formed by the deposition process. It is possible that process conditions may result in thin films that do not have parameters that fall within target parameters. If this happens, then integrated circuits formed from the semiconductor wafer 104 may not function properly. The quality of batches of semiconductor wafers may suffer. In some cases, some semiconductor wafers may need to be scrapped.

The thin-film deposition system 100 utilizes the control system 124 to dynamically adjust process conditions to ensure that deposition processes result in thin films having parameters or characteristics that fall within target parameters or characteristics. The control system 124 is connected to processing equipment associated with the thin-film deposition system 100. The processing equipment can include components shown in FIG. 1 and components not shown in FIG. 1. The control system 124 can control the flow rate of material from the fluid sources 108 and 110, the temperature of materials supplied by the fluid sources 108 and 110, the pressure of fluids provided by the fluid sources 108 and 110, the flow rate of material from purge sources 112 and 114, the duration of flow of materials from the fluid sources 108 and 110 and the purge sources 112 and 114, the temperature within the deposition chamber 102, the pressure within the deposition chamber 102, the humidity within the deposition chamber 102, and other aspects of the thin-film deposition process. The control system 124 controls these process parameters so that the thin-film deposition process results in a thin-film having target parameters such as a target thickness, a target composition, a target crystal orientation, etc.

The control system 124 utilizes machine learning processes in order to dynamically adjust process parameters to ensure the quality of thin films. As will be described in greater detail in relation to FIG. 2, the control system 124 utilizes a large amount of data related to a large number of historical thin-film deposition processes. The data includes historical process parameters and the parameters of the resulting thin films. The machine learning process trains an analysis model to predict thin-film characteristics based on a set of process parameters. After the analysis model has been trained, the control system 124 is able to dynamically select process parameters for future thin-film deposition processes.

In some cases, the thin-film deposition process can be very sensitive to concentrations or flow rates of the first and second fluids at the various stages during the thin-film deposition processes. If the concentration or flow rate of the first or second fluid is not sufficiently high at particular stages, then the thin film may not be formed properly on the substrate 104. For example, the thin film may not have a desired composition or thickness if the concentration or flow rate of the first or second fluid is not sufficiently high.

The amount of fluid remaining in the first and second fluid sources 108 and 110 can affect the flow rate or concentration of the first and second fluids in the deposition chamber 102. For example, if the first fluid source 108 has a low amount of the first fluid remaining, then the flow rate of the first fluid from the first fluid source 108 may be low. If the first fluid source 108 is empty and does not include any more of the first fluid, then there will be no flow of the first fluid from the first fluid source 108. The same considerations apply to the second fluid source 110. Low or nonexistent flow rates can result in a thin film that is not properly formed.

In one embodiment, the thin-film deposition system 100 includes an exhaust channel 120 communicatively coupled to the interior volume 103 of the deposition chamber 102. Exhaust products from the thin-film deposition process flow out of the interior volume 103 via the exhaust channel 120. The exhaust products can include unreacted portions of the first and second fluids, byproducts of the first and second fluids, purge fluids used to purge the interior volume 103, or other fluids or materials.

The thin-film deposition system 100 may include a byproduct sensor coupled to the exhaust channel 120. The byproduct sensor 122 is configured to sense the presence and/or concentration of byproducts from one or both of the first and second fluids in the exhaust fluids flowing through the exhaust channel 120. The first and second fluids interact together to form the thin film on the substrate 104. The deposition process also results in byproducts from the first and second fluids. The concentration of these byproducts is indicative of the concentration or flow rate of one or both of the first and second fluids during deposition. The byproduct sensor 122 senses the concentration of the byproducts in the exhaust fluids flowing from the interior volume 103 through the exhaust channel 120.

In one embodiment, the thin-film deposition system 100 includes a control system 124. The control system 124 is coupled to the byproduct sensor 122. The control system 124 receives the sensor signals from the byproduct sensor 122. The sensor signals from the byproduct sensor 122 are indicative of the concentration of byproducts of one or both of the first and second fluids in the exhaust fluid. The control system 124 can analyze the sensor signals and determine a flow rate or concentration of one or both of the first and second fluid sources 108, 110 during particular stages of the deposition process. The control system 124 can also determine a remaining level of the first fluid in the first fluid source 108 and/or of the second fluid in the second fluid source 110.

The control system 124 can include one or more computer readable memories. The one or more memories can store software instructions for analyzing sensor signals from the byproduct sensor 122 and for controlling various aspects of the thin-film deposition system 100 based on the sensor signals. The control system 124 can include one or more processors configured to execute the software instructions. The control system 124 can include communication resources that enable communication with the byproduct sensor 122 and other components of the thin-film deposition system 100.

In one embodiment, the control system 124 is communicatively coupled to the first and second fluid sources 108, 110 via one or more communication channels 125. The control system 124 can send signals to the first fluid source 108 and the second fluid source 110 via the communication channels 125. The control system 124 can control functionality of the first and second fluid sources 108, 110 responsive, in part, to the sensor signals from the byproduct sensor 122.

In one embodiment, the byproduct sensor 122 senses a concentration of byproducts in the exhaust fluid. The byproduct sensor 122 sends sensor signals to the control system 124. The control system 124 analyzes the sensor signals and determines that a recent flow rate of the first fluid from the first fluid source 108 was lower than expected, based on the sensor signals from the byproduct sensor 122. The control system 124 sends control signals to the first fluid source 108 commanding the first fluid source 108 to increase a flow rate of the first fluid during a subsequent deposition cycle. The first fluid source 108 increases the flow rate of the first fluid into the interior volume 103 of the deposition chamber 102 responsive to the control signals from the control system 124. The byproduct sensor 122 can again generate sensor signals indicative of the concentration of byproducts of the first fluid during the subsequent deposition cycle. The control system 124 can determine whether the flowrate of the first fluid needs to be adjusted based on the sensor signals from the byproduct sensor 122. In this way, the byproduct sensor 122, the control system 124, and the first fluid source 108 make up a feedback loop for adjusting the flowrate of the first fluid. The control system 124 can also control the second fluid source 110 in the same manner as the first fluid source 108. Furthermore, the control system 124 can control both the first fluid source 108 and the second fluid source 110.

In one embodiment, the thin-film deposition system 100 can include one or more valves, pumps, or other flow control mechanisms for controlling the flow rate of the first fluid from the first fluid source 108. These flow control mechanisms may be part of the fluid source 108 or may be separate from the fluid source 108. The control system 124 can be communicatively coupled to these flow control mechanisms or to systems that control these flow control mechanisms. The control system 124 can control the flowrate of the first fluid by controlling these mechanisms. The control system 100 may include valves, pumps, or other flow control mechanisms that control the flow of the second fluid from the second fluid source 110 in the same manner as described above in reference to the first fluid and the first fluid source 108.

In one embodiment, the control system 124 can determine how much of the first fluid remains in the first fluid source 108 based on the sensor signals from the byproduct sensor 122. The control system 124 may analyze the sensor signals to determine that the first fluid source 108 is empty or is nearly empty. The control system 124 can provide an indication to technicians or other personnel indicating that the first fluid source 108 is empty or nearly empty and that the first fluid source 108 should be refilled or replaced. These indications can be displayed on a display, can be transmitted via email, instant message, or other communication platforms that enable technicians or other experts or systems to understand that one or both of the first and second fluid sources 108, 110 are empty or nearly empty.

In one embodiment, the thin-film deposition system 100 includes a manifold mixer 116 and a fluid distributor 118. The manifold mixer 116 receives the first and second fluids, either together or separately, from the first fluid source 108 and the second fluid source 110. The manifold mixer 116 provides either the first fluid, the second fluid, or a mixture of the first and second fluids to the fluid distributor 118. The fluid distributor 118 receives one or more fluids from the manifold mixer 116 and distributes the one or more fluids into the interior volume 103 of the thin-film deposition chamber 102.

In one embodiment, the first fluid source 108 is coupled to the manifold mixer 116 by a first fluid channel 130. The first fluid channel 130 carries the first fluid from the fluid source 108 to the manifold mixer 116. The first fluid channel 130 can be a tube, pipe, or other suitable channel for passing the first fluid from the first fluid source 108 to the manifold mixer 116. The second fluid source 110 is coupled to the manifold mixer 116 by second fluid channel 132. The second fluid channel 132 carries the second fluid from the second fluid source 110 to the manifold mixer 116.

In one embodiment, the manifold mixer 116 is coupled to the fluid distributor 118 by a third fluid line 134. The third fluid line 134 carries fluid from the manifold mixer 116 to the fluid distributor 118. The third fluid line 134 may carry the first fluid, the second fluid, a mixture of the first and second fluids, or other fluids, as will be described in more detail below.

The first and second fluid sources 108, 110 can include fluid tanks. The fluid tanks can store the first and second fluids. The fluid tanks can selectively output the first and second fluids.

In one embodiment, the thin-film deposition system 100 includes a first purge source 112 and the second purge source 114. The first purge source is coupled to the first fluid line 130 by first purge line 136. The second purge source is coupled to the fluid line 132 by second purge line 138. In practice, the first and second purge sources may be a single purge source.

In one embodiment, the first and second purge sources 112, 114 supply a purging gas into the interior volume 103 of the deposition chamber 102. The purge fluid is a fluid selected to purge or carry the first fluid, the second fluid, byproducts of the first or second fluid, or other fluids from the interior volume 103 of the deposition chamber 102. The purge fluid is selected to not interact with the substrate 104, the thin-film layer deposited on the substrate 104, the first and second fluids, and byproducts of this first or second fluid. Accordingly, the purge fluid may be an inert gas including, but not limited to, Ar or N2.

After a cycle of flowing one or both of the first or second fluids into the interior volume 103, the thin-film deposition system 100 purges the interior volume 103 by flowing the purge fluid into the interior volume 103 and through the exhaust channel 120. The control system 124 can be communicatively coupled to the first and second purge sources 112, 114, or flow mechanisms that control the flow of the purge fluid from the first and second purge sources 112, 114. The control system 124 can purge the interior volume 103 after or between deposition cycles, as will be explained in more detail below.

In one embodiment, the first and second purge lines 136, 138 join the first and second fluid lines 130, 132 at selected angles. The angles are selected to ensure that the purge fluid flows toward the manifold mixer 116 and not toward the first or second fluid sources 108, 110. Likewise the angle helps ensure that the first and second fluids will flow from the first and second fluid sources 108, 110 toward the manifold mixer 116 and not toward the first and second purge sources 112, 114.

While FIG. 1 illustrates a first fluid source 108 and a second fluid source 110, in practice the thin-film deposition system 100 can include other numbers of fluid sources. For example, the thin-film deposition system 100 may include only a single fluid source or more than two fluid sources. Accordingly, the thin-film deposition system 100 can include a different number than two fluid sources without departing from the scope of the present disclosure.

Furthermore, the thin-film deposition system 100 has been described, in one embodiment, as an ALD system, the thin-film deposition system 100 can include other types of deposition systems without departing from the scope of the present disclosure. For example, the thin-film deposition system 100 can include a chemical vapor deposition system, a physical vapor deposition system, a sputtering system, or other types of thin-film deposition systems without departing from the scope of the present disclosure. A byproduct sensor 122 can be utilized to determine the flowrate or concentration of deposition fluids as well as how much deposition fluid remains in a deposition fluid source.

In one embodiment, the first fluid source 108 includes $H_2O$ in gas or liquid form. The second fluid source 110 includes $HfCL_4$ fluid. The $HfCL_4$ fluid may be a gas. The first and second fluids can be used to form a hafnium-based high-K gate dielectric layer for CMOS transistors.

During a first period of time, the first fluid ($H_2O$) is output from the first fluid source 108 into the interior volume 103. In one example, the first fluid flows for about 10 seconds, though other lengths of time can be used without departing from the scope of the present disclosure.

After the first period of time, a purge gas is output from the purge source 112 into the interior volume 103 during a second period of time. The purge gas may include nitrogen molecules ($N_2$) or another nonreactive gas. In one example, purge gas flows for 2-10 seconds, though other lengths of time can be used without departing from the scope of the present disclosure. The purge gas can flow from the purge source 112 or from both the purge source 112 and the purge source 114.

During a third period of time after the second period of time, $HfCL_4$ is output from the second fluid source 110 into the interior volume 103. In one example, the $HfCL_4$ flows for about 1-10 s, though other lengths of time can be used without departing from the scope of the present disclosure.

During a fourth period of time after the third period of time, a purge gas is output from the purge source 112 into the interior volume 103. In one example, purge gas flows for 1-10 s, though other lengths of time can be used without departing from the scope of the present disclosure. The purge gas can flow from the purge source 114 or from both the purge source 112 and the purge source 114.

In one embodiment, the seed layer includes functionalized oxygen atoms. When the first fluid ($H_2O$) is provided into the interior volume 103, the $H_2O$ molecules react with the functionalized oxygen atoms of the seed layer to form OH from each functionalized oxygen atom. The byproducts of this reaction, as well as any remaining $H_2O$ molecules, are purged from the interior volume 103 via the exhaust channel 120 by flow of the purge gas. The $HfCl_4$ is then provided into the interior volume 103. The $HfCl_4$ reacts with the OH compounds to form, on the substrate 104, Hf—O—$HfCl_3$. One of the byproducts of this reaction is HCl. The purge gas flows again, followed by $H_2O$. The $H_2O$ reacts with the Hf—O—$HfCl_3$ to form, on the substrate 104, Hf—$OH_3$. A byproduct of this reaction is HCl. The purge gas then flows again. The cycle can be repeated multiple times, as described above.

The control system 124 can utilize machine learning processes to dynamically adjust parameters of the ALD process between cycles and between depositions. Dynamically adjusting parameters can include adjusting the duration of time of the various fluid flow and purge cycles. Dynamically adjusting parameters can include adjusting the flow rate of fluids from the fluid sources 108 and 110 and from the purge sources 112 and 114.

Figure 2:
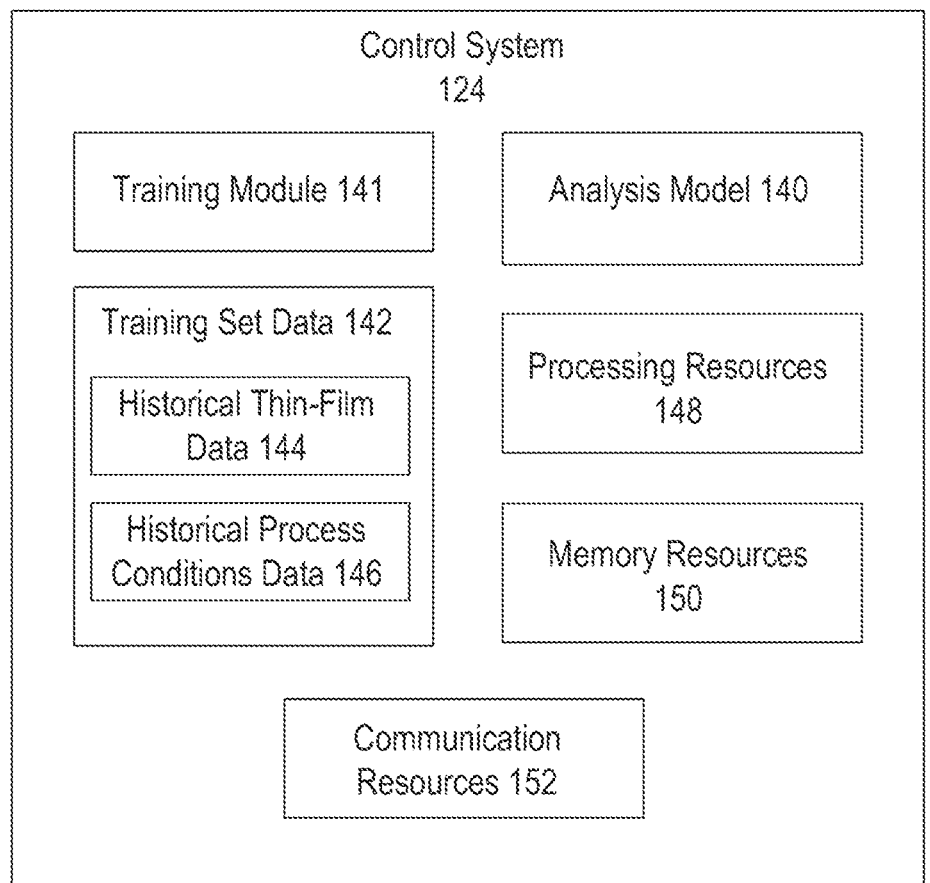
FIG. 2 is a block diagram of a control system of a thin-film deposition system, according to one embodiment.

FIG. 2 is a block diagram of the control system 124, according to one embodiment. The control system 124 of FIG. 2 is configured to control operation of an ALD system 100, according to one embodiment. The control system 124 utilizes machine learning to adjust parameters of the ALD system 100. The control system 124 can adjust parameters of the ALD system 100 between ALD runs or even between ALD cycles in order to ensure that a thin-film layer formed by the ALD process falls within selected specifications.

In one embodiment, the control system 124 includes an analysis model 140 and a training module 141. The training module trains the analysis model 140 with a machine learning process. The machine learning process trains the analysis model 140 to select parameters for an ALD process that will result in a thin film having selected characteristics. Although the training module 141 is shown as being separate from the analysis model 140, in practice, the training module 141 may be part of the analysis model 140.

The control system 124 includes, or stores, training set data 142. The training set data 142 includes historical thin-film data 144 and historical process conditions data 146. The historical thin-film data 144 includes data related to thin films resulting from ALD processes. The historical process conditions data 146 includes data related to process conditions during the ALD processes that generated the thin films. As will be set forth in more detail below, the training module 141 utilizes the historical thin-film data 144 and the historical process conditions data 146 to train the analysis model 140 with a machine learning process.

In one embodiment, the historical thin-film data 144 includes data related to the thickness of previously deposited thin films. For example, during operation of a semiconductor fabrication facility, thousands or millions of semiconductor wafers may be processed over the course of several months or years. Each of the semiconductor wafers may include thin films deposited by ALD processes. After each ALD process, the thicknesses of the thin films are measured as part of a quality control process. The historical thin-film data 144 includes the thicknesses of each of the thin films deposited by ALD processes. Accordingly, the historical thin-film data 144 can include thickness data for a large number of thin films deposited by ALD processes.

In one embodiment, the historical thin-film data 144 may also include data related to the thickness of thin films at intermediate stages of the thin-film deposition processes. For example, an ALD process may include a large number of deposition cycles during which individual layers of the thin film are deposited. The historical thin-film data 144 can include thickness data for thin films after individual deposition cycles or groups of deposition cycles. Thus, the historical thin-film data 144 not only includes data related to the total thickness of a thin film after completion of an ALD process, but may also include data related to the thickness of the thin film at various stages of the ALD process.

In one embodiment, the historical thin-film data 144 includes data related to the composition of the thin films deposited by ALD processes. After a thin film is deposited, measurements can be made to determine the elemental or molecular composition of the thin films. Successful deposition of the thin films results in a thin film that includes particular proportions of certain elements or compounds. Unsuccessful depositions may result in a thin film that does not include the specified proportions of elements or compounds. The historical thin-film data 144 can include data from measurements indicating the elements or compounds that make up the various thin films.

In one embodiment, the historical thin-film data 144 includes data related to crystal structures of thin films deposited by ALD processes. Successful deposition of a thin film may result in a particular crystal structure. X-ray crystallography measurements may be made on the thin films to determine the crystal structures of the various thin films. The historical thin-film data 144 can include crystal structure data for the various thin films.

In one embodiment, the historical process conditions 146 include various process conditions or parameters during ALD processes that produce the thin films associated with the historical thin-film data 144. Accordingly, for each thin film having data in the historical thin-film data 144, the historical process conditions data 146 can include the process conditions or parameters that were present during deposition of the thin film. For example, the historical process conditions data 146 can include data related to the pressure, temperature, and fluid flow rates within the process chamber during ALD processes.

The historical process conditions data 146 can include data related to remaining amounts of precursor material in the fluid sources during ALD processes. The historical process conditions data 146 can include data related to the age of the deposition chamber 102, the number of deposition processes that have been performed in the deposition chamber 102, a number of deposition processes that have been performed in the process chamber 102 since the most recent cleaning cycle of the process chamber 102, or other data related to the process chamber 102. The historical process conditions data 146 can include data related to compounds or fluids introduced into the process chamber 102 during the deposition process. The data related to the compounds can include types of compounds, phases of compounds (solid, gas, or liquid), mixtures of compounds, or other aspects related to compounds or fluids introduced into the process chamber 102. The historical process conditions data 146 can include data related to the humidity within the process chamber 102 during ALD processes. The historical process conditions data 146 can include data related to light absorption, light adsorption, and light reflection related to the process chamber 102. The historical process conditions data 126 can include data related to the length of pipes, tubes, or conduits that carry compounds or fluids into the process chamber 102 during ALD processes. The historical process conditions data 146 can include data related to the condition of carrier gases that carry compounds or fluids into the process chamber 102 during ALD processes.

In one embodiment, historical process conditions data 146 can include process conditions for each of a plurality of individual cycles of a single ALD process. Accordingly, the historical process conditions data 146 can include process conditions data for a very large number of ALD cycles.

In one embodiment, the training set data 142 links the historical thin-film data 144 with the historical process conditions data 146. In other words, the thin-film thickness, material composition, or crystal structure associated with a thin film in the historical thin-film data 144 is linked to the process conditions data associated with that deposition process. As will be set forth in more detail below, the labeled training set data can be utilized in a machine learning process to train the analysis model 140 to predict semiconductor process conditions that will result in properly formed thin films.

In one embodiment the analysis model 140 includes a neural network. Training of the analysis model 140 will be described in relation to a neural network. However, other types of analysis models or algorithms can be used without departing from the scope of the present disclosure. The training module 141 utilizes the training set data 142 to train the neural network with a machine learning process. During the training process, the neural network receives, as input, historical process conditions data 146 from the training set data. During the training process, the neural network outputs predicted thin-film data. The predicted thin-film data predicts characteristics of a thin film that would result from the historical process conditions data. The training process trains the neural network to generate predicted thin-film data. The predicted thin-film data can include thin-film thickness, thin-film density, thin film composition, or other thin film parameters.

In one embodiment, the neural network includes a plurality of neural layers. The various neural layers include neurons that define one or more internal functions. The internal functions are based on weighting values associated with neurons of each neural layer of the neural network. During training, the control system 124 compares, for each set of historical process conditions data, the predicted thin-film data to the actual historical thin-film data associated with the thin film that resulted from those process conditions. The control system generates an error function indicating how closely the predicted thin-film data matches the historical thin-film data. The control system 124 then adjusts the internal functions of the neural network. Because the neural network generates predicted thin-film data based on the internal functions, adjusting the internal functions will result in the generation of different predicted thin-film data for a same set of historical process conditions data. Adjusting the internal functions can result in predicted thin-film data that produces larger error functions (worse matching to the historical thin-film data 144) or smaller error functions (better matching to the historical thin-film data 144).

After adjusting the internal functions of the neural network, the historical process conditions data 146 is again passed to the neural network and the analysis model 140 again generates predicted thin films data. The training module 141 again compares the predicted thin-film data to the historical thin-film data 144. The training module 141 again adjusts the internal functions of the neural network. This process is repeated in a very large number of iterations of monitoring the error functions and adjusting the internal functions of the neural network until a set of internal functions is found that results in predicted thin-film data that matches the historical thin-film data 144 across the entire training set.

At the beginning of the training process, the predicted thin-film data likely will not match the historical thin-film data 144 very closely. However, as the training process proceeds through many iterations of adjusting the internal functions of the neural network, the errors functions will trend smaller and smaller until a set of internal functions is found that results in predicted thin-film data that match the historical thin-film data 144. Identification of a set of internal functions that results in predicted thin-film data that matches the historical thin-film data 144 corresponds to completion of the training process. Once the training process is complete, the neural network is ready to be used to adjust thin-film deposition process parameters.

In one embodiment, after the analysis model 140 has been trained, the analysis model 140 can be utilized to generate sets of process conditions that will result in thin films having selected characteristics. For example, the control system 124 can provide the analysis model 140 with target thin-film parameters corresponding to desired parameters of a thin film. The target parameters can include a thickness of the film, a composition of the thin film, a crystal structure of the thin film, or other target parameters. As is set forth in more detail below, the analysis model 140 identifies a set of process parameters that will result in a thin film having the target parameters. In particular, the analysis model 140 generates process adjustment data indicating process parameters that should be utilized for the next thin-film deposition process or the next phase in the thin-film deposition process.

In one embodiment, the analysis model 140 utilizes current process parameter data to assist in generating process adjustment data. The current process parameter data includes data related to current conditions of processing equipment associated with the thin-film deposition processes. For example, the current process conditions data can include a current age of an ampoule that will be utilized in a thin-film deposition process. The current age of the ampoule can indicate one or both of an actual age of the ampoule and a number of deposition processes that have been performed with the ampoule. The current process parameter data can include remaining material levels in the fluid sources 108 and 110 or the purge sources 112 and 114. The current process parameter data can include the types of materials that will be utilized in the thin-film deposition process. The current process conditions data can include data related to a phase of materials that will be utilized in the thin-film deposition process. The current process conditions data can include the lengths of pipes, conduits, or tubes that will carry fluids or materials into the deposition chamber.

The current process conditions data can include data related to the semiconductor wafer or other target that will be utilized in the next deposition process. For example, the current process conditions data can include an effective exposed plain area of the semiconductor wafer. The current process conditions data can include a crystal orientation of the exposed effective plain area of the semiconductor wafer. The current process conditions data can include a roughness index of the exposed effective plain area. The current process conditions data can include an exposed effective sidewall tilting associated with surface features of the semiconductor wafer or other target. The current process conditions data can include a thin-film function group associated with the exposed surface of the semiconductor wafer or other target. The current process conditions data can include the function group of an exposed sidewall of a feature of a semiconductor wafer or other target. The current process conditions data can include the wafer rotation or tilt parameters associated with the semiconductor wafer or other target.

Accordingly, the current process conditions data can include fixed conditions for the next thin-film deposition process or the next phase of a thin-film deposition process. The current process conditions data can include many of the same types of data included in the historical process conditions data 146.

In one embodiment, the current process conditions data can include data related to the temperature within the deposition chamber during the deposition process. The current process conditions data can include data related to the pressure within the deposition chamber during the deposition process. The current process conditions data can include data related to the humidity within the deposition chamber.

In one embodiment, the analysis model 140 utilizes the current process conditions data and the target thin-film parameter data in order to generate process adjustment data. The process adjustment data identifies process parameters that should be utilized for the next thin-film deposition process or for the next phase of a thin-film deposition process based on the current process conditions data and the target thin-film parameter data. The process adjustment data corresponds to conditions or parameters that can be changed or adjusted for the next deposition process or next thin-film deposition process. Examples of parameters that may be adjusted include the flow rate of fluids or materials into the deposition chamber from the fluid sources 108 and 110, the temperature within the deposition chamber, the pressure within the deposition chamber, the time duration of the deposition process or phase of a deposition process, voltage levels to be applied during the thin-film deposition process, or other aspects that can be dynamically adjusted between thin-film deposition processes or between phases of a thin-film deposition process. The analysis model 140 can identify values for these parameters that will result in a thin film having the target thin-film parameters such as target thickness, target composition, target crystal structure, or other characteristics.

In one embodiment, the analysis model 140 generates process adjustment data by passing the current process conditions data to the analysis model 140. The analysis model 140 will then select trial values for dynamic process conditions that can be adjusted. The analysis model 140 will then generate predicted thin-film data based on the current process conditions data and the trial values for dynamic process conditions. The predicted thin-film data includes a predicted thickness, a predicted composition, a predicted crystal structure, or other predicted characteristics of a thin film that would result from a thin-film deposition process based on the current process conditions data and the dynamic process conditions data. If the predicted thin-film data falls within the target thin-film parameters, then the analysis model 140 can generate process adjustment data specifying values for the dynamic process conditions data. The specified values will be utilized for the next thin-film deposition process or the next phase of the thin-film deposition process. If the predicted thin-film data does not fall within the target thin-film parameters, then the analysis model 140 selects other trial values for the dynamic process conditions data and generates predicted thin-film data based on the new trial values. This process is repeated in iterations until values for the dynamic process conditions are found that result in predicted thin-film data that falls within the target thin-film parameters.

In one embodiment, because the analysis model 140 has been trained with a machine learning process that trains the analysis model 140 to generate thin-film data based on process conditions data, the analysis model 140 is able to identify process adjustment data that will result in a thin-film having parameters that fall within the target thin-film parameters. The analysis model 140 can generate process adjustment data in a very short amount of time. For example, the analysis model 140 can generate process adjustment data in less than three seconds, though other values are possible without departing from the scope of the present disclosure. Accordingly, the analysis model 140 can be run between each thin-film deposition process or between each phase of a thin-film deposition process.

In one embodiment, the control system 124 includes processing resources 148, memory resources 150, and communication resources 152. The processing resources 148 can include one or more controllers or processors. The processing resources 148 are configured to execute software instructions, process data, make thin-film deposition control decisions, perform signal processing, read data from memory, write data to memory, and to perform other processing operations. The processing resources 148 can include physical processing resources 148 located at a site or facility of the thin-film deposition system 100. The processing resources can include virtual processing resources 148 remote from the site thin-film deposition system 100 or a facility at which the thin-film deposition system 100 is located. The processing resources 148 can include cloud-based processing resources including processors and servers accessed via one or more cloud computing platforms.

In one embodiment, the memory resources 150 can include one or more computer readable memories. The memory resources 150 are configured to store software instructions associated with the function of the control system and its components, including, but not limited to, the analysis model 140. The memory resources 150 can store data associated with the function of the control system 124 and its components. The data can include the training set data 142, current process conditions data, and any other data associated with the operation of the control system 124 or any of its components. The memory resources 150 can include physical memory resources located at the site or facility of the thin-film deposition system 100. The memory resources can include virtual memory resources located remotely from site or facility of the thin-film deposition system 100. The memory resources 150 can include cloud-based memory resources accessed via one or more cloud computing platforms.

In one embodiment, the communication resources can include resources that enable the control system 124 to communicate with equipment associated with the thin-film deposition system 100. For example, the communication resources 152 can include wired and wireless communication resources that enable the control system 124 to receive the sensor data associated with the thin-film deposition system 100 and to control equipment of the thin-film deposition system 100. The communication resources 152 can enable the control system 124 to control the flow of fluids or other material from the fluid sources 108 and 110 and from the purge sources 112 and 114. The communication resources 152 can enable the control system 124 to control heaters, voltage sources, valves, exhaust channels, wafer transfer equipment, and any other equipment associated with the thin-film deposition system 100. The communication resources 152 can enable the control system 124 to communicate with remote systems. The communication resources 152 can include, or can facilitate communication via, one or more networks such as wire networks, wireless networks, the Internet, or an intranet. The communication resources 152 can enable components of the control system 124 to communicate with each other.

In one embodiment, the analysis model 140 is implemented via the processing resources 148, the memory resources 150, and the communication resources 152. The control system 124 can be a dispersed control system with components and resources and locations remote from each other and from the thin-film deposition system 100.

Figure 3A:
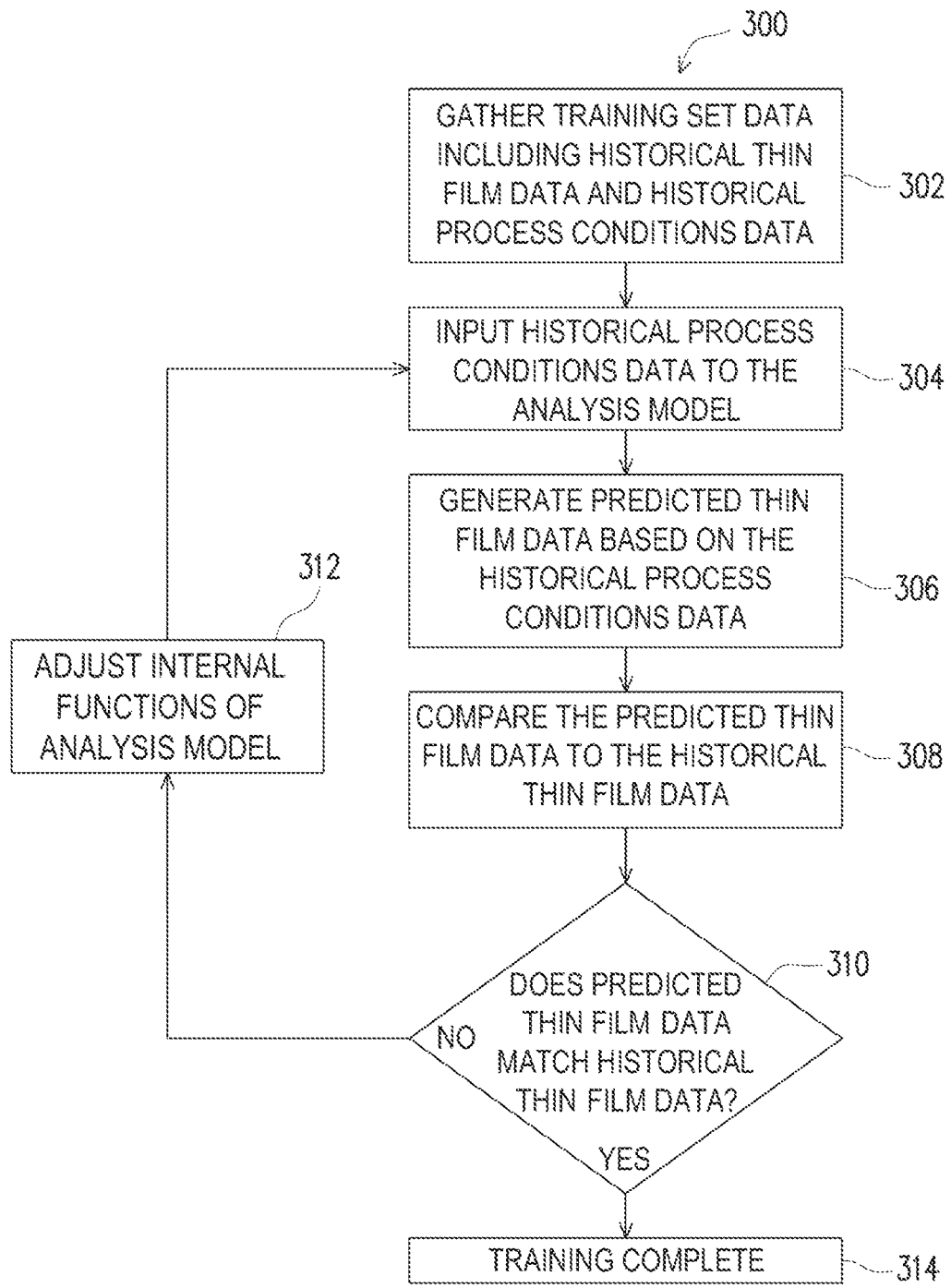
FIG. 3A is flow diagram of a process for training an analysis model of a control system, according to one embodiment.

FIG. 3A is a flow diagram of a process 300 for training an analysis model to identify process conditions that will result in proper deposition of a thin film, according to one embodiment. One example of an analysis model is the analysis model 140 of FIG. 2. The various steps of the process 300 can utilize components, processes, and techniques described in relation to FIGS. 1-2. Accordingly, FIG. 3A is described with reference to FIGS. 1-2.

At 302, the process 300 gathers training set data including historical thin-film data and historical process conditions data. This can be accomplished by using a data mining system or process. The data mining system or process can gather training set data by accessing one or more databases associated with the thin-film deposition system 100 and collecting and organizing various types of data contained in the one or more databases. The data mining system or process, or another system or process, can process and format the collected data in order to generate a training set data. The training set data 142 can include historical thin-film data 144 and historical process conditions data 146 as described in relation to FIG. 2.

At 304, the process 300 inputs historical process conditions data to the analysis model. In one example, this can include inputting historical process conditions data 146 into the analysis model 140 with the training module 141 as described in relation to FIG. 2. The historical process conditions data can be provided in consecutive discrete sets to the analysis model 140. Each district set can correspond to a single thin-film deposition process or a portion of a single thin-film deposition process. The historical process conditions data can be provided as vectors to the analysis model 140. Each set can include one or more vectors formatted for reception processing by the analysis model 140. The historical process conditions data can be provided to the analysis model 140 in other formats without departing from the scope of the present disclosure.

At 306, the process 300 generates predicted thin-film data based on historical process conditions data. In particular, the analysis model 140 generates, for each set of historical thin-film conditions data 146, predicted thin-film data. The predicted thin-film data corresponds to a prediction of characteristics of a thin film that would result from that particular set of process conditions. The predicted thin-film data can include thickness, uniformity, composition, crystal structure, or other aspects of a thin film.

At 308, the predicted thin-film data is compared to the historical thin-film data 144. In particular, the predicted thin-film data for each set of historical process conditions data is compared to the historical thin-film data 144 associated with that set of historical process conditions data. The comparison can result in an error function indicating how closely the predicted thin-film data matches the historical thin-film data 144. This comparison is performed for each set of predicted thin-film data. In one embodiment, this process can include generating an aggregated error function or indication indicating how the totality of the predicted thin-film data compares to the historical thin-film data 144. These comparisons can be performed by the training module 141 or by the analysis model 140. The comparisons can include other types of functions or data than those described above without departing from the scope of the present disclosure.

At 310, the process 300 determines whether the predicted thin-film data matches the historical thin-film data based on the comparisons generated at step 308. In one example, if the aggregate error function is less than an error tolerance, then the process 300 determines that the thin-film data does not match the historical thin-film data. In one example, if the aggregate error function is greater than an error tolerance, then the process 300 determines that the thin-film data does match the historical thin-film data. In one example, the error tolerance can include a tolerance between 0.1 and 0. In other words, if the aggregate percentage error is less than 0.1, or 10%, then the process 300 considers that the predicted thin-film data matches the historical thin-film data. If the aggregate percentage error is greater than 0.1 or 10%, then the process 300 considers that the predicted thin-film data does not match the historical thin-film data. Other tolerance ranges can be utilized without departing from the scope of the present disclosure. Error scores can be calculated in a variety of ways without departing from the scope of the present disclosure. The training module 141 or the analysis model 140 can make the determinations associated with process step 310.

In one embodiment, if the predicted thin-film data does not match the historical thin-film data 144 at step 310, then the process proceeds to step 312. At step 312, the process 300 adjusts the internal functions associated with the analysis model 140. In one example, the training module 141 adjusts the internal functions associated with the analysis model 140. From step 312, the process returns to step 304. At step 304, the historical process conditions data is again provided to the analysis model 140. Because the internal functions of the analysis model 140 have been adjusted, the analysis model 140 will generate different predicted thin-film data that in the previous cycle. The process proceeds to steps 306, 308 and 310 and the aggregate error is calculated. If the predicted thin-film data does not match the historical thin-film data, then the process returns to step 312 and the internal functions of the analysis model 140 are adjusted again. This process proceeds in iterations until the analysis model 140 generates predicted thin-film data that matches the historical thin-film data 144.

In one embodiment, if the predicted thin-film data matches the historical thin-film data then process step 310, in the process 300, proceeds to 314. At step 314 training is complete. The analysis model 140 is now ready to be utilized to identify process conditions and can be utilized in thin-film deposition processes performed by the thin-film deposition system 100. The process 300 can include other steps or arrangements of steps than shown and described herein without departing from the scope of the present disclosure.

Figure 3B:
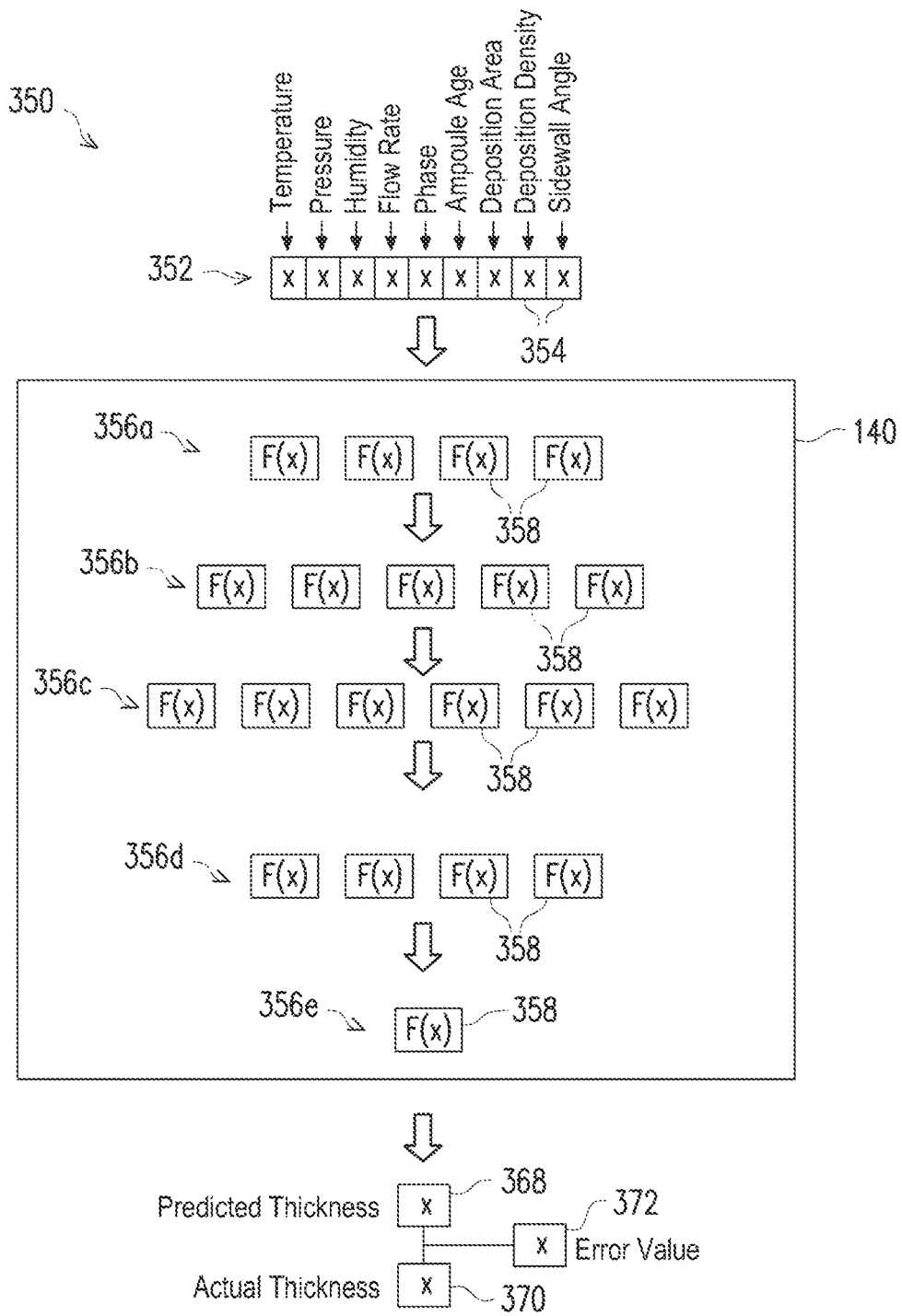
FIG. 3B is a block diagram illustrating operational and training aspects of an analysis mode, according to one embodiment.

FIG. 3B is a block diagram 350 illustrating operational aspects and training aspects of analysis model 140, according to one embodiment. As described previously, the training set data 142 includes data related to a plurality of previously performed thin-film deposition processes. Each previously performed thin-film deposition process took place with particular process conditions and resulted in a thin-film having a particular characteristics. The process conditions for each previously performed thin-film deposition process are formatted into a respective process conditions vector 352. The process conditions vector includes a plurality of data fields 354. Each data field 354 corresponds to a particular process condition.

The example of FIG. 3B illustrates a single process conditions vector 352 that will be passed to the analysis model 140 during the training process. In the example of FIG. 3B, the process conditions vector 352 includes nine data fields 354. A first data field 354 corresponds to the temperature during the previously performed thin-film deposition process. A second data field 356 corresponds to the pressure during the previously performed thin-film deposition process. A third data field 354 corresponds to the humidity during the previously performed thin-film deposition process. The fourth data field 354 corresponds to the flow rate of deposition materials during the previously performed thin-film deposition process. The fifth data field 354 corresponds to the phase (liquid, solid, or gas) of deposition materials during the previously performed thin-film deposition process. The sixth data field 354 corresponds to the age of the ampoule used in the previously performed thin-film deposition process. The seventh data field 354 corresponds to a size of a deposition area on a wafer during the previously performed thin-film deposition process. The eighth data field 354 corresponds to the density of surface features of the wafer utilized during the previously performed thin-film deposition process. The ninth data field corresponds to the angle of sidewalls of surface features during the previously performed thin-film deposition process. In practice, each process conditions vector 352 can include more or fewer data fields than are shown in FIG. 3B without departing from the scope of the present disclosure. Each process conditions vector 352 can include different types of process conditions without departing from the scope of the present disclosure. The particular process conditions illustrated in FIG. 3B are given only by way of example. Each process condition is represented by a numerical value in the corresponding data field 354. For condition types that are not naturally represented in numbers, such as material phase, a number can be assigned to each possible phase.

The analysis model 140 includes a plurality of neural layers 356a-e. Each neural layer includes a plurality of nodes 358. Each node 358 can also be called a neuron. Each node 358 from the first neural layer 356a receives the data values for each data field from the process conditions vector 352. Accordingly, in the example of FIG. 3B, each node 358 from the first neural layer 356a receives nine data values because the process conditions vector 352 has nine data fields. Each neuron 358 includes a respective internal mathematical function labeled F(x) in FIG. 3B. Each node 358 of the first neural layer 356a generates a scalar value by applying the internal mathematical function F(x) to the data values from the data fields 354 of the process conditions vector 352. Further details regarding the internal mathematical functions F(x) are provided below.

Each node 358 of the second neural layer 356b receives the scalar values generated by each node 358 of the first neural layer 356a. Accordingly, in the example of FIG. 3B each node of the second neural layer 356B receives four scalar values because there are four nodes 358 in the first neural layer 356a. Each node 358 of the second neural layer 356b generates a scalar value by applying the respective internal mathematical function F(x) to the scalar values from the first neural layer 356a.

Each node 358 of the third neural layer 356c receives the scalar values generated by each node 358 of the second neural layer 356b. Accordingly, in the example of FIG. 3B each node 358 of the third neural layer 356c receives five scalar values because there are five nodes 358 in the second neural layer 356b. Each node 358 of the third neural layer 356c generates a scalar value by applying the respective internal mathematical function F(x) to the scalar values from the nodes 358 of the second neural layer 356b.

Each node 358 of the neural layer 356d receives the scalar values generated by each node 358 of the previous neural layer (not shown). Each node 358 of the neural layer 356d generates a scalar value by applying the respective internal mathematical function F(x) to the scalar values from the nodes 358 of the second neural layer 356b.

The final neural layer includes only a single node 358. The final neural layer receives the scalar values generated by each node 358 of the previous neural layer 356d. The node 358 of the final neural layer 356e generates a data value 368 by applying a mathematical function F(x) to the scalar values received from the nodes 358 of the neural layer 356d.

In the example of FIG. 3B, the data value 368 corresponds to the predicted thickness of a thin film generated by process conditions data corresponding to values included in the process conditions vector 352. In other embodiments, the final neural layer 356e may generate multiple data values each corresponding to a particular thin-film characteristic such as thin-film crystal orientation, thin-film uniformity, or other characteristics of a thin film. The final neural layer 356e will include a respective node 358 for each output data value to be generated. In the case of a predicted thin film thickness, engineers can provide constraints that specify that the predicted thin film thickness 368 must fall within a selected range, such as between 0 nm and 50 nm, in one example. The analysis model 140 will adjust internal functions F(x) to ensure that the data value 368 corresponding to the predicted thin film thickness will fall within the specified range.

During the machine learning process, the analysis model compares the predicted thickness in the data value 368 to the actual thickness of the thin-film as indicated by the data value 370. As set forth previously, the training set data 142 includes, for each set of historical process conditions data, thin-film characteristics data indicating the characteristics of the thin-film that resulted from the historical thin-film deposition process. Accordingly, the data field 370 includes the actual thickness of the thin-film that resulted from the deposition process reflected in the process conditions vector 352. The analysis model 140 compares the predicted thickness from the data value 368 to the actual thickness from the data value 370. The analysis model 140 generates an error value 372 indicating the error or difference between the predicted thickness from the data value 368 and the actual thickness from the data value 370. The error value 372 is utilized to train the analysis model 140.

The training of the analysis model 140 can be more fully understood by discussing the internal mathematical functions F(x). While all of the nodes 358 are labeled with an internal mathematical function F(x), the mathematical function F(x) of each node is unique. In one example, each internal mathematical function has the following form:

$$F(x) = x_1 * w_1 + x_2 * w_2 + \ldots x_n * w_1 + b.$$

In the equation above, each value $x_1$-$x_n$ corresponds to a data value received from a node 358 in the previous neural layer, or, in the case of the first neural layer 356a, each value $x_1$-$x_n$ corresponds to a respective data value from the data fields 354 of the process conditions vector 352. Accordingly, n for a given node is equal to the number of nodes in the previous neural layer. The values $w_1$-$w_n$ are scalar weighting values associated with a corresponding node from the previous layer. The analysis model 140 selects the values of the weighting values $w_1$-$w_n$. The constant b is a scalar biasing value and may also be multiplied by a weighting value. The value generated by a node 358 is based on the weighting values $w_1$-$w_n$. Accordingly, each node 358 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 372 has been calculated, the analysis model 140 adjusts the weighting values $w_1$-$w_n$ for the various nodes 358 of the various neural layers 356a-356e. After the analysis model 140 adjusts the weighting values $w_1$-$w_n$, the analysis model 140 again provides the process conditions vector 352 to the input neural layer 356a. Because the weighting values are different for the various nodes 358 of the analysis model 140, the predicted thickness 368 will be different than in the previous iteration. The analysis model 140 again generates an error value 372 by comparing the actual thickness 370 to the predicted thickness 368.

The analysis model 140 again adjusts the weighting values $w_1$-$w_n$ associated with the various nodes 358. The analysis model 140 again processes the process conditions vector 352 and generates a predicted thickness 368 and associated error value 372. The training process includes adjusting the weighting values $w_1$-$w_n$ in iterations until the error value 372 is minimized.

FIG. 3B illustrates a single process conditions vector 352 being passed to the analysis model 140. In practice, the training process includes passing a large number of process conditions vectors 352 through the analysis model 140, generating a predicted thickness 368 for each process conditions vector 352, and generating associated error value 372 for each predicted thickness. The training process can also include generating an aggregated error value indicating the average error for all the predicted thicknesses for a batch of process conditions vectors 352. The analysis model 140 adjusts the weighting values $w_1$-$w_n$ after processing each batch of process conditions vectors 352. The training process continues until the average error across all process conditions vectors 352 is less than a selected threshold tolerance. When the average error is less than the selected threshold tolerance, the analysis model 140 training is complete and the analysis model is trained to accurately predict the thickness of thin films based on the process conditions. The analysis model 140 can then be used to predict thin-film thicknesses and to select process conditions that will result in a desired thin-film thickness. During use of the trained model 140, a process conditions vector, representing current process condition for a current thin film deposition process to be performed, and having the same format at the process conditions vector 352, is provided to the trained analysis model 140. The trained analysis model 140 can then predict the thickness of a thin film that will result from those process conditions.

A particular example of a neural network based analysis model 140 has been described in relation to FIG. 3B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 4:
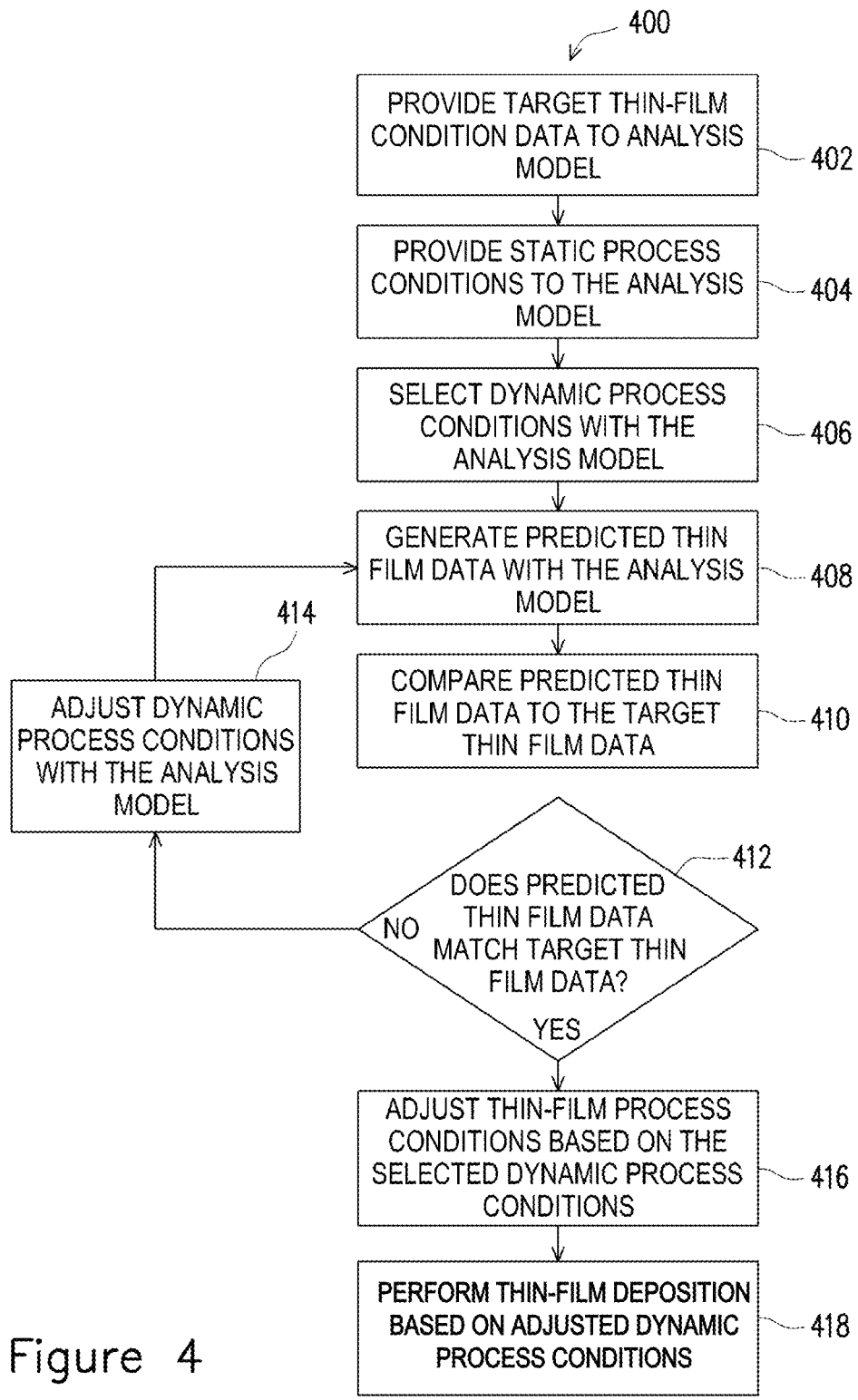
FIG. 4 is a flow diagram of a process for performing a thin-film deposition process in conjunction with an analysis model, according to one embodiment.

FIG. 4 is a flow diagram of a process 400 for dynamically selecting process conditions for thin-film deposition process and for performing a thin-film deposition process, according to one embodiment. The various steps of the process 400 can utilize components, processes, and techniques described in relation to FIGS. 1-3B. Accordingly, FIG. 4 is described with reference to FIGS. 1-3B.

At 402, the process 400 provides target thin-film conditions data to the analysis model 140. The target thin-film conditions data identifies selected characteristics of a thin film to be formed by thin-film deposition process. The target thin-film conditions data can include a target thickness, a target composition, target crystal structure, or other characteristics of the thin film. The target thin-film conditions data can include a range of thicknesses. The target condition or characteristics that can be selected are based on thin film characteristic(s) utilized in the training process. In the example of FIG. 3B, the training process focused on thin film thickness.

At 404, the process 400 provides static process conditions to the analysis model 140. The static process conditions include process conditions that will not be adjusted for a next thin-film deposition process. The static process conditions can include the target device pattern density indicating the density of patterns on the wafer on which the thin-film deposition process will be performed. The static process conditions can include an effective plan area crystal orientation, an effective plan area roughness index, an effective sidewall area of the features on the surface of the semiconductor wafer, an exposed effective sidewall tilt angle, an exposed surface film function group, an exposed sidewall film function group, a rotation or tilt of the semiconductor wafer, process gas parameters (materials, phase of materials, and temperature of materials), a remaining amount of material fluid in the fluid sources 108 and 110, a remaining amount of fluid in the purge sources 112 and 114, a humidity within a deposition chamber, an age of an ampoule utilized in the deposition process, light absorption or reflection within the deposition chamber, the length of pipes or conduits that will provide fluids to the deposition chamber, or other conditions. The static process conditions can include conditions other than those described above without departing from the scope of the present disclosure. Furthermore, in some cases, some of the static process conditions listed above may be dynamic process conditions subject to adjustment as will be described in more detail below. In the example of FIG. 3B, dynamic process conditions include temperature, pressure, humidity, and flow rate. Static process conditions include phase, ampoule age, deposition area, deposition density, and sidewall angle.

At 406, the process 400 selects dynamic process conditions for the analysis model, according to one embodiment. The dynamic process conditions can include any process conditions not designated as static process conditions. For example, the training set data may include a large number of various types of process conditions data in the historical process conditions data 146. Some of these types of process conditions will be defined the static process conditions and some of these types of process conditions will be defined as dynamic process conditions. Accordingly, when the static process conditions are supplied at step 404, the remaining types of process conditions can be defined as dynamic process conditions. The analysis model 140 can initially select initial values for the dynamic process conditions. After the initial values have been selected for the dynamic process conditions, the analysis model has a full set of process conditions to analyze. In one embodiment, the initial values for the dynamic process conditions may be selected based on previously determined starter values, or in accordance with other schemes.

The dynamic process conditions can include the flow rate of fluids or materials from the fluid sources 108 and 110 during the deposition process. The dynamic process conditions can include the flow rate of fluids or materials from the purge sources 112 and 114. The dynamic process conditions can include a pressure within the deposition chamber, a temperature within the deposition chamber, a humidity within the deposition chamber, durations of various steps of the deposition process, or voltages or electric field generated within the deposition chamber. The dynamic process conditions can include other types of conditions without departing from the scope of the present disclosure.

At 408, the analysis model 140 generates predicted thin-film data based on the static and dynamic process conditions. The predicted thin-film data includes the same types of thin-film characteristics established in the target thin-film conditions data. In particular, the predicted thin-film data includes the types of predicted thin-film data from the training process described in relation to FIGS. 3A and 3B. For example, the predicted thin-film data can include thin-film thickness, film composition, or other parameters of thin films.

At 410, the process compares the predicted thin-film data to the target thin-film data. In particular, the analysis model 140 compares the predicted thin-film data to the target thin-film data. The comparison indicates how closely the predicted thin-film data matches the target thin-film data. The comparison can indicate whether or not predicted thin-film data falls within tolerances or ranges established by the target thin-film data. For example, if the target thin-film thickness is between 2 nm and 4 nm, then the comparison will indicate whether the predicted thin-film data falls within this range.

At 412, if the predicted thin-film data does not match the target thin-film data, then the process proceeds to 414. At 414, the analysis model 140 adjusts the dynamic process conditions data. From 414 the process returns to 408. At 408, the analysis model 140 again generates predicted thin-film data based on the static process conditions and the adjusted dynamic process conditions. The analysis model then compares the predicted thin-film data to the target thin-film data at 410. At 412, if the predicted thin-film data does not match the target thin-film data, then the process proceeds to 414 and the analysis model 140 again adjusts the dynamic process conditions. This process proceeds until predicted thin-film data is generated that matches the target thin-film data. If the predicted thin-film data matches the target thin-film data 412, then the process proceeds to 416.

At 416, the process 400 adjusts the thin-film process conditions of the thin-film deposition system 100 based on the dynamic process conditions that resulted in predicted thin-film data within the target thin-film data. For example, the control system 124 can adjust fluid flow rates, deposition step durations, pressure, temperature, humidity, or other factors in accordance with the dynamic process conditions data.

At 418, the thin-film deposition system 100 performs a thin-film deposition process in accordance with the adjusted dynamic process conditions identified by the analysis model. In one embodiment, the thin-film deposition process is an ALD process. However, other thin-film deposition processes can be utilized without departing from the scope of the present disclosure. In one embodiment, the thin-film deposition system 100 adjusts the process parameters based on the analysis model between individual deposition stages in a thin-film deposition process. For example, in an ALD process, the thin-film is deposited one layer at a time. The analysis model 140 can identify parameters to be utilized for deposition of the next layer. Accordingly, the thin-film deposition system can adjust deposition conditions between the various deposition stages.

Figure 5:
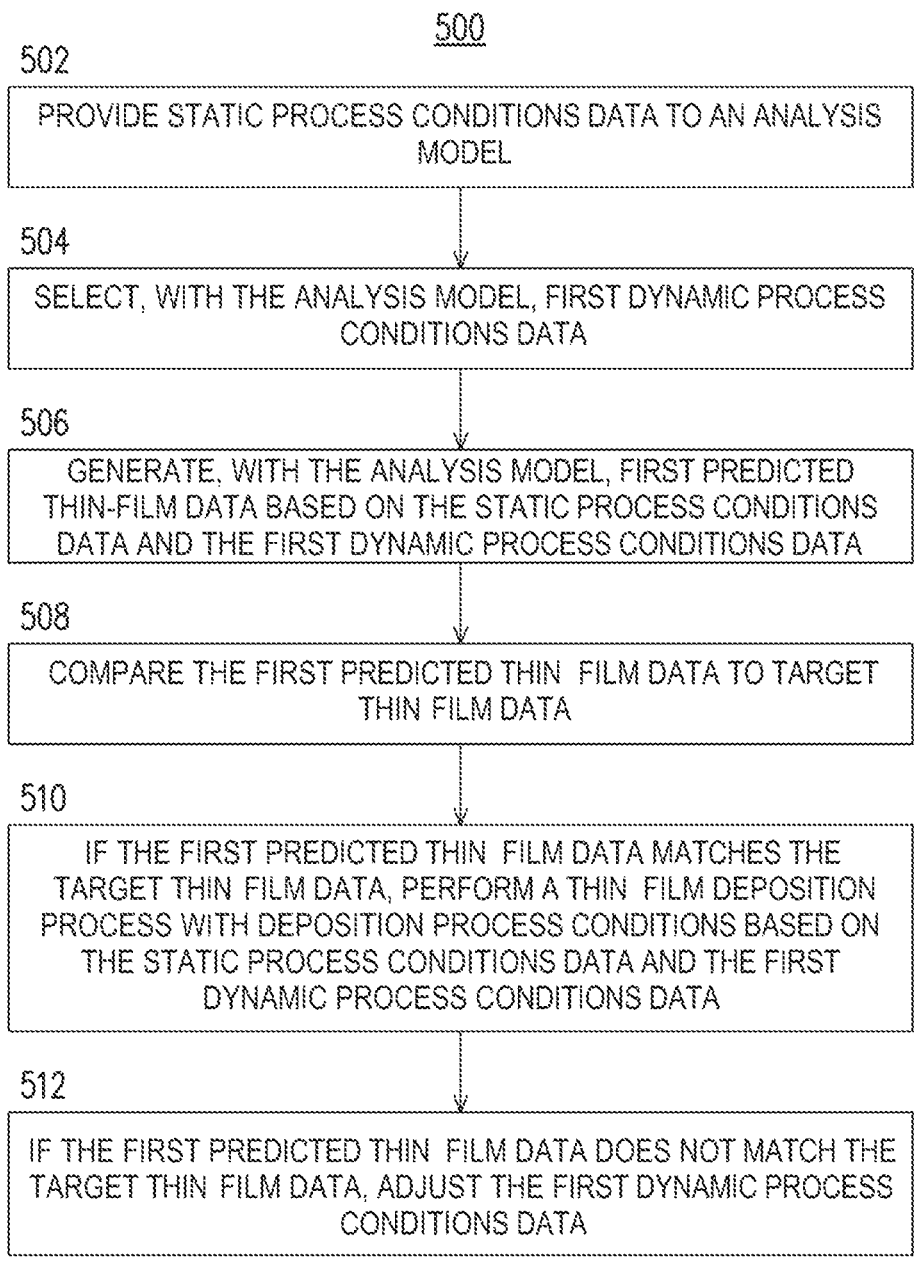
FIG. 5 is a flow diagram of a method for forming a thin film, according to one embodiment.

FIG. 5 is a flow diagram of a thin-film deposition method 500, according to one embodiment. At 502, the method 500 includes providing static process conditions data to an analysis model. One example of an analysis model is the analysis model 140 of FIG. 2. At 504, the method 500 includes selecting, with the analysis model, first dynamic process conditions data. At 506, the method 500 includes generating, with the analysis model, first predicted thin-film data based on the static process conditions data and the first dynamic process conditions data. At 508, the method 500 includes comparing the first predicted thin-film data to target thin-film data. At 510, the method 500 includes, if the first predicted thin-film data matches the target thin-film data, performing a thin-film deposition process with deposition process conditions based on the static process conditions data and the first dynamic process conditions data. At 512, the method 500 includes, if the first predicted thin-film data does not match the target thin-film data, adjusting the first dynamic process conditions data.

Figure 6:
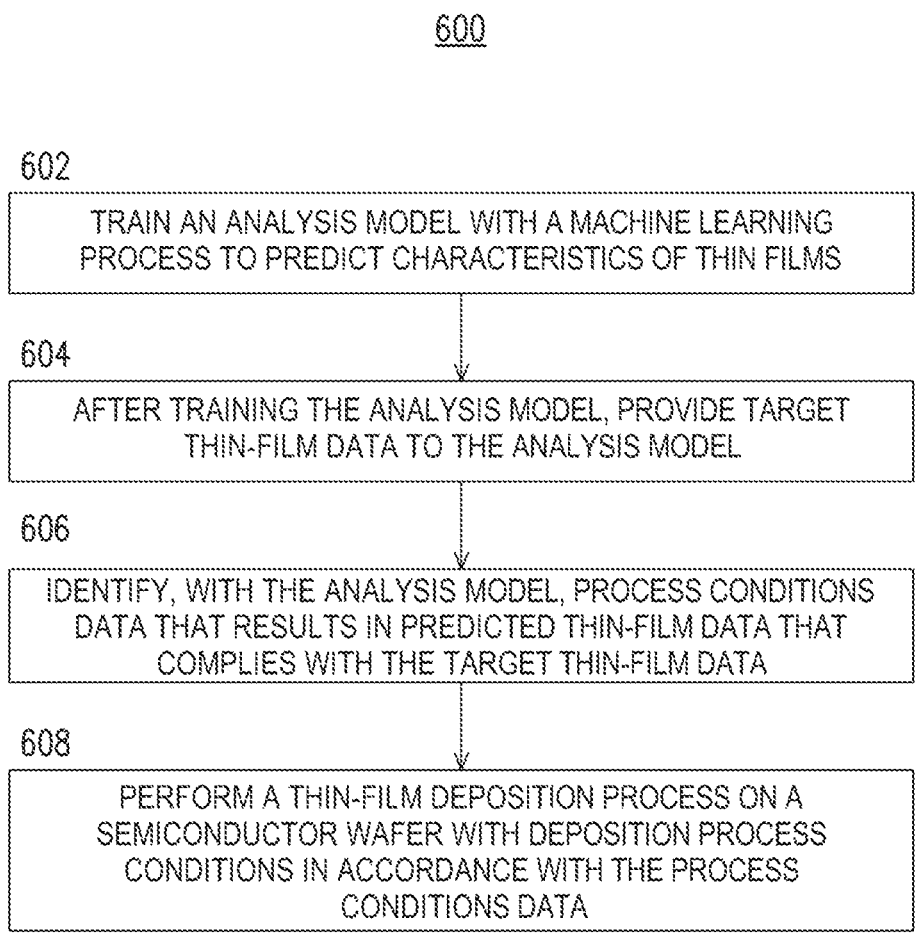
FIG. 6 is a flow diagram of a method for forming a thin film, according to one embodiment.

FIG. 6 is a flow diagram of a thin-film deposition method 600, according to one embodiment. At 602, the method 600 includes training an analysis model with a machine learning process to predict characteristics of thin films. One example of an analysis model is the analysis model 140 of FIG. 2. At 604, the method 600 includes after training the analysis model, providing target thin-film data to the analysis model. At 606, the method 600 includes identifying, with the analysis model, process conditions data that results in predicted thin-film data that complies with the target thin-film data. At 608, the method 600 includes performing a thin-film deposition process on a semiconductor wafer with deposition process conditions in accordance with the process conditions data. One example of a semiconductor wafer is the semiconductor wafer 104 of FIG. 1.

In one embodiment, a thin-film deposition method includes providing static process conditions data to an analysis model. The method includes selecting, with the analysis model, first dynamic process conditions data. The method includes generating, with the analysis model, first predicted thin-film data based on the static process conditions data and the first dynamic process conditions data. The method includes comparing the first predicted thin-film data to target thin-film data. The method includes if the first predicted thin-film data matches the target thin-film data, performing a thin-film deposition process with deposition process conditions based on the static process conditions data and the first dynamic process conditions data. The method includes if the first predicted thin-film data does not match the target thin-film data, adjusting the first dynamic process conditions data.

In one embodiment, a thin-film deposition method includes training an analysis model with a machine learning process to predict characteristics of thin films. The method includes, after training the analysis model, providing target thin-film data to the analysis model. The method includes identifying, with the analysis model, process conditions data that results in predicted thin-film data that complies with the target thin-film data. The method includes performing a thin-film deposition process on a semiconductor wafer with deposition process conditions in accordance with the process conditions data.

In one embodiment, a thin-film deposition system includes a thin-film deposition chamber, a support configured to support a substrate within the thin-film deposition chamber, and a fluid source configured to provide a fluid into the thin-film deposition chamber during a thin-film deposition process. The system includes a control system configured to identify process conditions data for the thin-film deposition process based on a machine learning process and to control the first fluid source during the thin-film deposition process in accordance with the process conditions data.

Embodiments of the present disclosure provide thin films of reliable thickness and composition. Embodiments of the present disclosure dynamically adjust process parameters to ensure that thin films have desired properties.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   depositing, with an atomic layer deposition process, a first portion of a layer on a structure on a semiconductor wafer;
   sensing, with a sensor, one or more dynamic process conditions present while depositing the first portion of the layer to generate sensor data;
   providing structure data to an analysis model including structural characteristics of the structure;
   generating, with the analysis model, first predicted layer data of the layer based on the structure data and the sensor data indicating the one or more dynamic process conditions of depositing the first portion of the layer;
   comparing the first predicted layer data to target layer data, the target layer data indicating a crystal orientation;
   generating dynamic process conditions adjustment data based on the comparing the first predicted layer data to the target layer data; and
   depositing a second portion of the layer on the structure on the semiconductor wafer by adjusting the atomic layer deposition process based on the dynamic process conditions adjustment data.

2. The method of claim 1, further comprising:
   generating second predicted layer data based on the dynamic process conditions adjustment data;
   comparing second predicted layer data to the target layer data; and
   in response to the second predicted layer data matches the target layer data, performing the layer deposition process with process conditions based on the dynamic process conditions adjustment data.

3. The method of claim 1, wherein performing the layer deposition process includes performing a first cycle of the atomic layer deposition process using first dynamic process conditions data.

4. The method of claim 3, further comprising, after the first cycle:
   identifying, with the analysis model, second dynamic process conditions data; and
   performing a second cycle of the atomic layer deposition process based on the structure data and the second dynamic process conditions data.

5. The method of claim 1, wherein the analysis model includes a neural network.

6. The method of claim 1, wherein the structure data includes one or more of:
   a deposition material;
   features of a deposition surface; or
   an age of deposition equipment.

7. The method of claim 6, wherein the first dynamic process conditions data includes one or more of:
   a flow rate of the deposition material;
   a duration of flow of the deposition material;
   a pressure in a deposition chamber;
   a temperature in the deposition chamber; or
   a humidity in the deposition chamber.

8. The method of claim 1, wherein the target layer data identifies a target layer thickness range.

9. A method, comprising:
   receiving structure data, by an analysis model, the structure data including structural characteristics of a structure on a semiconductor wafer;
   selecting, with the analysis model, first dynamic process conditions data;
   generating, with the analysis model, first predicted layer data based on the structure data and the first dynamic process conditions data;
   performing a first cycle of an atomic layer deposition process including depositing a first portion of an atomic layer on the structure;
   generating, with a sensor, sensor data while depositing the first portion of the atomic layer;
   after the first cycle, identifying, with the analysis model, second dynamic process conditions data based on the structure data, the first dynamic process conditions data, the sensor data, and target layer data indicating a target crystal orientation; and
   performing a second cycle of the atomic layer deposition process based on the second dynamic process conditions data, including depositing a second portion of the atomic layer on the structure on the semiconductor wafer.

10. The method of claim 9, wherein the analysis model includes a neural network.

11. The method of claim 9, wherein the structure data includes one or more of:
    a material of the structure;
    a sidewall tilt angle of the structure; or
    an exposed surface film function group of the structure.

12. The method of claim 11, wherein the first dynamic process conditions data includes one or more of:
    a flow rate of the deposition material;
    a duration of flow of the deposition material;
    a pressure in a deposition chamber;
    a temperature in the deposition chamber; or
    a humidity in the deposition chamber.

13. The method of claim 9, wherein the target layer data identifies a target layer thickness.

14. A method, comprising:
    providing structure data to an analysis model, the structure data indicating structural characteristics of a structure on a semiconductor wafer;
    identifying, with the analysis model, first dynamic process conditions data that result in first predicted layer data that matches target layer data including a target crystal orientation;
    depositing a first portion of a layer on the structure by performing a first deposition process on the semiconductor wafer based on the structure data and the first dynamic process conditions data;
    sensing, with a sensor, a condition of a byproduct of the first deposition process while depositing the first portion of the layer to generate sensor data;
    after performing the first deposition process, identifying, with the analysis model, second dynamic process conditions data that result in second predicted layer data that matches the target layer data based on the sensor data and the structure data; and depositing a second portion of the layer on the structure by performing a second deposition process on the semiconductor wafer based on the second dynamic process conditions.

15. The method of claim 14, wherein the analysis model includes a neural network.

16. The method of claim 14, wherein the structure data includes one or more of:

a material of the structure;

a sidewall tilt angle of the structure; or an exposed surface film function group of the structure.

17. The method of claim 14, wherein the first dynamic process conditions data includes one or more of:

a flow rate of a deposition material;

a duration of flow of the deposition material;

a pressure in a deposition chamber;

a temperature in the deposition chamber; or a humidity in the deposition chamber.

18. The method of claim 14, wherein the sensor is positioned within a deposition chamber.

19. The method of claim 14, wherein the target layer data identifies a target layer thickness range.

20. The method of claim 14, wherein the sensing the condition of the byproduct include sensing a concentration of a byproduct in an exhaust fluid of the depositing the first portion.

* * * * *